United States Patent
Ramaswamy et al.

(10) Patent No.: US 12,505,982 B2
(45) Date of Patent: Dec. 23, 2025

(54) METHOD AND APPARATUS FOR DIGITAL CONTROL OF ION ENERGY DISTRIBUTION IN A PLASMA

(71) Applicant: Applied Materials, Inc., Santa Clara, CA (US)

(72) Inventors: Kartik Ramaswamy, San Jose, CA (US); Yang Yang, Cupertino, CA (US); Yue Guo, Redwood City, CA (US)

(73) Assignee: Applied Materials, Inc., Santa Clara, CA (US)

( * ) Notice: Subject to any disclaimer, the term of this patent is extended or adjusted under 35 U.S.C. 154(b) by 798 days.

(21) Appl. No.: 17/891,044

(22) Filed: Aug. 18, 2022

(65) Prior Publication Data
US 2023/0071168 A1    Mar. 9, 2023

Related U.S. Application Data

(60) Provisional application No. 63/242,410, filed on Sep. 9, 2021.

(51) Int. Cl.
*H01J 37/32* (2006.01)

(52) U.S. Cl.
CPC .. *H01J 37/32128* (2013.01); *H01J 37/32091* (2013.01); *H01J 2237/0048* (2013.01); *H01J 2237/334* (2013.01)

(58) Field of Classification Search
None
See application file for complete search history.

(56) References Cited

U.S. PATENT DOCUMENTS

| 8,916,022 B1* | 12/2014 | Caron | H01J 37/32477 118/723 AN |
|---|---|---|---|
| 9,396,908 B2* | 7/2016 | Marakhtanov | H01J 37/32577 |
| 10,236,765 B2* | 3/2019 | Kain | H02M 3/07 |
| 10,283,330 B2* | 5/2019 | Marakhtanov | H01J 37/32165 |

(Continued)

FOREIGN PATENT DOCUMENTS

| CN | 109155618 A | 1/2019 |
|---|---|---|
| EP | 2806553 B1 | 8/2021 |

(Continued)

OTHER PUBLICATIONS

Taiwan Office Action dated Sep. 13, 2024 for Taiwan Patent Application No. 111133650.

(Continued)

*Primary Examiner* — Srinivas Sathiraju
(74) *Attorney, Agent, or Firm* — Patterson + Sheridan, LLP (57) ABSTRACT

Embodiments provided herein generally include apparatus, plasma processing systems and methods for generation of a waveform for plasma processing of a substrate in a processing chamber. Embodiments of the disclosure include an apparatus and method for generating a pseudo-staircase waveform that includes coupling, during a first phase of generating a waveform, a first voltage supply to an output node; coupling, during a second phase of generating the waveform, a first capacitor between the output node and an electrical ground node; and coupling during a third phase of generating the waveform, the first capacitor and a second capacitor in a series path between the output node and the electrical ground node.

20 Claims, 7 Drawing Sheets

(56) References Cited

U.S. PATENT DOCUMENTS

| | | | | |
|---|---|---|---|---|
| 11,190,167 | B2* | 11/2021 | Bozorg | H04B 1/16 |
| 11,335,539 | B2* | 5/2022 | Bhowmick | H01J 37/32155 |
| 12,127,779 | B2* | 10/2024 | Günther | A61B 18/1206 |
| 2002/0122131 | A1* | 9/2002 | Sergio | G01D 5/24 |
| | | | | 348/294 |
| 2005/0243322 | A1* | 11/2005 | Lasker | G01N 21/4795 |
| | | | | 356/432 |
| 2007/0092958 | A1* | 4/2007 | Syed | B82Y 5/00 |
| | | | | 435/286.1 |
| 2014/0004804 | A1* | 1/2014 | Suh | H01Q 23/00 |
| | | | | 333/17.1 |
| 2015/0137840 | A1* | 5/2015 | Whittington | G05F 1/46 |
| | | | | 324/750.01 |
| 2015/0235808 | A1* | 8/2015 | Kamp | H01J 37/3211 |
| | | | | 156/345.48 |
| 2016/0206893 | A1* | 7/2016 | Raymond | A61N 1/36146 |
| 2016/0223669 | A1* | 8/2016 | Assefzadeh | G01S 7/411 |
| 2017/0256393 | A1* | 9/2017 | Kim | H01J 37/32403 |
| 2018/0025891 | A1* | 1/2018 | Marakhtanov | H01J 37/32568 |
| | | | | 438/714 |
| 2019/0207587 | A1* | 7/2019 | Bozorg | H03H 17/0416 |
| 2019/0229707 | A1* | 7/2019 | Bozorg | H03H 17/0255 |
| 2019/0244788 | A1* | 8/2019 | Marakhtanov | H01J 37/32935 |
| 2020/0234922 | A1 | 7/2020 | Dorf et al. | |
| 2021/0027990 | A1 | 1/2021 | Ziemba et al. | |
| 2021/0027991 | A1* | 1/2021 | Ventzek | H01L 21/0262 |
| 2021/0151296 | A1* | 5/2021 | Ventzek | H01L 21/0262 |
| 2021/0319980 | A1* | 10/2021 | Bhowmick | H01J 37/32174 |
| 2021/0330371 | A1* | 10/2021 | Günther | A61B 18/1206 |
| 2022/0199366 | A1* | 6/2022 | Bhowmick | H01J 37/32091 |
| 2023/0067046 | A1* | 3/2023 | Ramaswamy | H03K 3/57 |
| 2023/0071168 | A1* | 3/2023 | Ramaswamy | H01J 37/32091 |
| 2024/0186112 | A1* | 6/2024 | Bhowmick | H01J 37/32155 |
| 2025/0195128 | A1* | 6/2025 | Günther | A61B 18/1206 |

FOREIGN PATENT DOCUMENTS

| | | |
|---|---|---|
| JP | H02276420 A | 11/1990 |
| JP | 2001291829 A | 10/2001 |
| JP | 2007089373 A | 4/2007 |
| JP | 2010-508638 A | 3/2010 |
| JP | 2010103465 A | 5/2010 |
| JP | 2013257977 A | 12/2013 |
| KR | 2010-0133947 A | 12/2010 |
| KR | 10-2019-0103930 A | 9/2019 |
| KR | 2020-0086751 A | 7/2020 |
| TW | 201931428 A | 8/2019 |
| WO | 2020-094723 A1 | 5/2020 |

OTHER PUBLICATIONS

Korean Office Action dated Mar. 26, 2025 for Application No. 10-2024-7009056.

Japanese Office Action dated Feb. 4, 2025 for Application No. 2024-515650.

International Search Report and Written Opinion dated Dec. 12, 2022 for Application No. PCT/US2022/040803.

* cited by examiner

METHOD AND APPARATUS FOR DIGITAL CONTROL OF ION ENERGY DISTRIBUTION IN A PLASMA

CROSS-REFERENCE TO RELATED APPLICATION

This application claims benefit of U.S. provisional patent application Ser. No. 63/242,410, filed Sep. 9, 2021, which is herein incorporated by reference.

DESCRIPTION OF THE RELATED ART

Reliably producing high aspect ratio features is one of the key technology challenges for the next generation of semiconductor devices. One method of forming high aspect ratio features uses a plasma-assisted etching process in which a plasma is formed in a processing chamber and ions from the plasma are accelerated towards a surface of a substrate to form openings in a material layer disposed beneath a mask layer formed on the surface of the substrate.

In a typical plasma-assisted etching process, the substrate is positioned on a substrate support disposed in a processing chamber, a plasma is formed over the substrate, and ions are accelerated from the plasma towards the substrate across a plasma sheath, i.e., region depleted of electrons, formed between the plasma and the surface of the substrate.

It has been found that conventional radio frequency (RF) plasma-assisted etching processes, which only deliver sinusoidal waveform containing RF signals to one or more of the electrodes in a plasma processing chamber, do not adequately or desirably control the sheath properties and generated ion energies, which leads to undesirable plasma processing results. The undesirable processing results can include excessive sputtering of the mask layer and the generation of sidewall defects in high-aspect ratio features.

Accordingly, there is a need in the art for plasma processing and biasing methods that are able to provide desirable plasma-assisted etching process results.

SUMMARY

Embodiments provided herein generally include apparatus, plasma processing systems and methods for generation of a voltage waveform (e.g., a pseudo-staircase voltage waveform) for plasma processing of a substrate in a processing chamber.

Some embodiments are directed to a waveform generator. The waveform generator generally includes a first voltage supply; a first switch coupled between the first voltage supply and an output node of the waveform generator; a second switch; and a capacitor array, wherein the second switch is coupled between the output node and the capacitor array, wherein the capacitor array comprises: a first capacitor coupled to the second switch; a third switch coupled between the first capacitor and an electrical ground node; a second capacitor selectively coupled to a node between the first capacitor and the third switch; and a fourth switch coupled between the second capacitor and the electrical ground node.

Some embodiments are directed to a method for waveform generation. The method generally includes coupling, during a first phase of generating a waveform, a first voltage supply to an output node; coupling, during a second phase of generating the waveform, a first capacitor between the output node and an electrical ground node; and coupling during a third phase of generating the waveform, the first capacitor and a second capacitor in a series path between the output node and the electrical ground node.

Some embodiments are directed to an apparatus for waveform generation. The apparatus generally includes a memory, and one or more processors coupled to the memory. The memory and the one or more processors are configured to: couple, during a first phase of generating a waveform, a first voltage supply to an output node; couple, during a second phase of generating the waveform, a first capacitor between the output node and an electrical ground node; and couple during a third phase of generating the waveform, the first capacitor and a second capacitor in a series path between the output node and the electrical ground node.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope and may admit to other equally effective embodiments.

DETAILED DESCRIPTION

With technology nodes advancing towards 2 nm, fabrication of smaller features with larger aspect ratios involve atomic precision for plasma processing. For etching processes where plasma ions play an important role, ion energy control is challenging the semiconductor equipment industry. Traditionally radio frequency (RF) biased techniques use a sinusoidal wave to excite plasma and accelerate ions that interact with a surface of a substrate.

Some embodiments of the present disclosure are generally directed to techniques for generating a pseudo-staircase voltage waveform for controlling ion energy distribution (IED) in a plasma. For example, the techniques described herein may enable digital control of the IED, using a network of capacitors (e.g., external to an integrated circuit), switches and direct current (DC) power supplies generating the pseudo-staircase voltage waveform, to maintain a negative voltage on an electrode within a plasma processing system, such as an electrode within an electrostatic chuck, as the substrate, which positioned over the electrode, is being discharged by a positive ion current from a plasma. The process of maintaining a constant negative voltage on the electrode while the substrate is being discharged by the positive ion current is referred to as current compensation. The techniques may provide a finer control of the IED, by creating multiple ion energy peaks, through a digital command from a processing chamber controller.

The techniques described herein provide several advantages over conventional methods for ion energy control. For example, while some conventional methods allow for the creation of a single energy peak, the techniques described herein enable the creation of multiple ion energy peaks that can be tailored to meet a specification. Moreover, while some conventional methods use an external current source to implement current compensation, the embodiments of the present disclosure implement current compensation without the use of an external current source, reducing hardware area consumption. The techniques described herein may also allow etching of different materials with greater selectivity and deposition of films with improved film properties. Furthermore, the techniques described herein may allow for creating a substrate bias in processing chambers that have poor radio frequency (RF) current returns by operating in periodic transient regimes.

Plasma Processing System Examples

Figure 1:
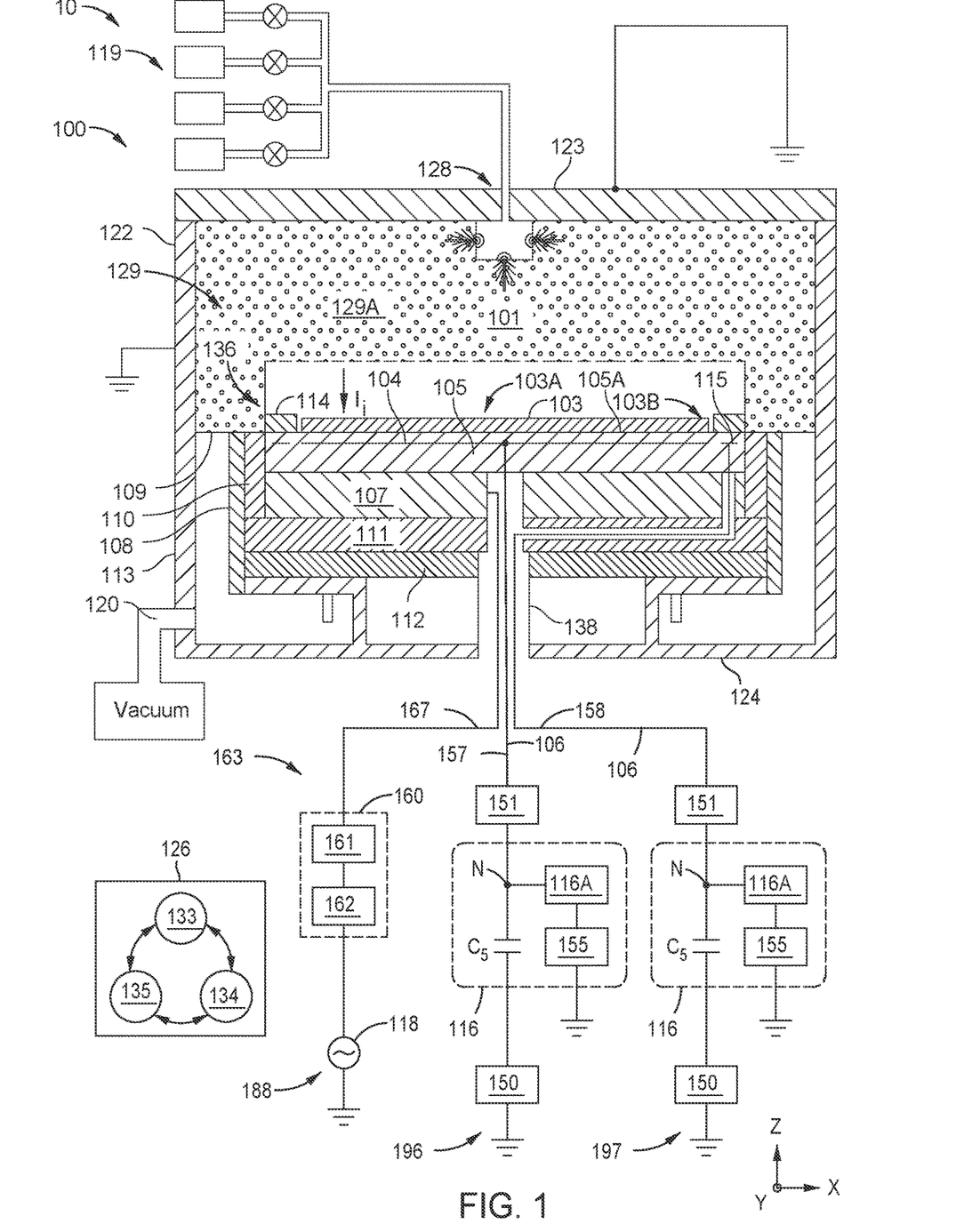
FIG. 1 is a schematic cross-sectional view of a processing system, according to one or more embodiments, configured to practice the methods set forth herein.

FIG. 1 is a schematic cross-sectional view of a processing system 10 configured to perform one or more of the plasma processing methods set forth herein. In some embodiments, the processing system 10 is configured for plasma-assisted etching processes, such as a reactive ion etch (RIE) plasma processing. However, it should be noted that the embodiments described herein may be also be used with processing systems configured for use in other plasma-assisted processes, such as plasma-enhanced deposition processes, for example, plasma-enhanced chemical vapor deposition (PECVD) processes, plasma-enhanced physical vapor deposition (PEPVD) processes, plasma-enhanced atomic layer deposition (PEALD) processes, plasma treatment processing or plasma-based ion implant processing, for example, plasma doping (PLAD) processing.

As shown, the processing system 10 is configured to form a capacitively coupled plasma (CCP), where the processing chamber 100 includes an upper electrode (e.g., chamber lid 123) disposed in a processing volume 129 facing a lower electrode (e.g., the substrate support assembly 136) also disposed in the processing volume 129. In a typical capacitively coupled plasma (CCP) processing system, a radio frequency (RF) source (e.g., RF generator 118) is electrically coupled to one of the upper or lower electrode, and delivers an RF signal configured to ignite and maintain a plasma (e.g., the plasma 101). In this configuration, the plasma is capacitively coupled to each of the upper and lower electrodes and is disposed in a processing region therebetween. Typically, the opposing one of the upper or lower electrodes is coupled to ground or to a second RF power source. One or more components of the substrate support assembly 136, such as the support base 107 is electrically coupled to a plasma generator assembly 163, which includes the RF generator 118, and the chamber lid 123 is electrically coupled to ground. As shown, the processing system 10 includes a processing chamber 100, a substrate support assembly 136, and a system controller 126.

The processing chamber 100 typically includes a chamber body 113 that includes the chamber lid 123, one or more sidewalls 122, and a chamber base 124, which collectively define the processing volume 129. The one or more sidewalls 122 and chamber base 124 generally include materials that are sized and shaped to form the structural support for the elements of the processing chamber 100 and are configured to withstand the pressures and added energy applied to them while a plasma 101 is generated within a vacuum environment maintained in the processing volume 129 of the processing chamber 100 during processing. In one example, the one or more sidewalls 122 and chamber base 124 are formed from a metal, such as aluminum, an aluminum alloy, or a stainless steel alloy.

A gas inlet 128 disposed through the chamber lid 123 is used to deliver one or more processing gases to the processing volume 129 from a processing gas source 119 that is in fluid communication therewith. A substrate 103 is loaded into, and removed from, the processing volume 129 through an opening (not shown) in one of the one or more sidewalls 122, which is sealed with a slit valve (not shown) during plasma processing of the substrate 103.

The system controller 126, also referred to herein as a processing chamber controller, includes a central processing unit (CPU) 133, a memory 134, and support circuits 135. The system controller 126 is used to control the process sequence used to process the substrate 103, including the substrate biasing methods described herein. The CPU 133 is a general-purpose computer processor configured for use in an industrial setting for controlling the processing chamber and sub-processors related thereto. The memory 134 described herein, which is generally non-volatile memory, may include random access memory, read-only memory, floppy or hard disk drive, or other suitable forms of digital storage, local or remote. The support circuits 135 are conventionally coupled to the CPU 133 and comprise cache, clock circuits, input/output subsystems, power supplies, and the like, and combinations thereof. Software instructions (program) and data can be coded and stored within the memory 134 for instructing a processor within the CPU 133. A software program (or computer instructions) readable by CPU 133 in the system controller 126 determines which tasks are performable by the components in the processing system 10.

Typically, the program, which is readable by CPU 133 in the system controller 126, includes code, which, when executed by the processor (CPU 133), performs tasks relating to the plasma processing schemes described herein. The program may include instructions that are used to control the various hardware and electrical components within the processing system 10 to perform the various process tasks and various process sequences used to implement the methods described herein. In one embodiment, the program includes instructions that are used to perform one or more of the operations described below in relation to FIGS. 4-7.

The processing system may include a plasma generator assembly 163, a first pulsed voltage (PV) source assembly 196 for establishing a first PV waveform at a bias electrode 104, and a second PV source assembly 197 for establishing a second PV waveform at an edge control electrode 115. The first PV waveform or the second PV waveform may be generated using a waveform generator as described in more detail herein with respect to FIGS. 4, 5 and 6. In some embodiments, the plasma generator assembly 163 delivers an RF signal to the support base 107 (e.g., power electrode or cathode) which may be used to generate (maintain and/or ignite) a plasma 101 in a processing region disposed between the substrate support assembly 136 and the chamber lid 123. In some embodiments, the RF generator 118 is configured to deliver an RF signal having a frequency that is greater than 1 MHz or more, or about 2 MHz or more, such as about 13.56 MHz or more.

As discussed above, in some embodiments, the plasma generator assembly 163, which includes an RF generator 118 and an RF generator assembly 160, is generally configured to deliver a desired amount of a continuous wave (CW) or pulsed RF power at a desired substantially fixed sinusoidal waveform frequency to a support base 107 of the substrate support assembly 136 based on control signals provided from the system controller 126. During processing, the plasma generator assembly 163 is configured to deliver RF power (e.g., an RF signal) to the support base 107 disposed proximate to the substrate support 105, and within the substrate support assembly 136. The RF power delivered to the support base 107 is configured to ignite and maintain a processing plasma 101 of processing gases disposed within the processing volume 129.

In some embodiments, the support base 107 is an RF electrode that is electrically coupled to the RF generator 118 via an RF matching circuit 162 and a first filter assembly 161, which are both disposed within the RF generator assembly 160. The first filter assembly 161 includes one or more electrical elements that are configured to substantially prevent a current generated by the output of a PV waveform generator 150 from flowing through an RF power delivery line 167 and damaging the RF generator 118. The first filter assembly 161 acts as a high impedance (e.g., high Z) to the PV signal generated from a PV pulse generator PG1 within the PV waveform generator 150, and thus inhibits the flow of current to the RF matching circuit 162 and RF generator 118.

In some embodiments, the RF generator assembly 160 and RF generator 118 are used to ignite and maintain a processing plasma 101 using the processing gases disposed in the processing volume 129 and fields generated by the RF power (RF signal) delivered to the support base 107 by the RF generator 118. The processing volume 129 is fluidly coupled to one or more dedicated vacuum pumps through a vacuum outlet 120, which maintain the processing volume 129 at sub-atmospheric pressure conditions and evacuate processing and/or other gases, therefrom. In some embodiments, the substrate support assembly 136, disposed in the processing volume 129, is disposed on a support shaft 138 that is grounded and extends through the chamber base 124. However, in some embodiments, the RF generator assembly 160 is configured to deliver an RF power to the bias electrode 104 disposed in the substrate support 105 versus the support base 107.

The substrate support assembly 136, as briefly discussed above, generally includes the substrate support 105 (e.g., ESC substrate support) and support base 107. In some embodiments, the substrate support assembly 136 can additionally include an insulator plate 111 and a ground plate 112, as is discussed further below. The support base 107 is electrically isolated from the chamber base 124 by the insulator plate 111, and the ground plate 112 is interposed between the insulator plate 111 and the chamber base 124. The substrate support 105 is thermally coupled to and disposed on the support base 107. In some embodiments, the support base 107 is configured to regulate the temperature of the substrate support 105, and the substrate 103 disposed on the substrate support 105, during substrate processing.

Typically, the substrate support 105 is formed of a dielectric material, such as a bulk sintered ceramic material, such as a corrosion-resistant metal oxide or metal nitride material, for example, aluminum oxide ($Al_2O_3$), aluminum nitride (AlN), titanium oxide (TiO), titanium nitride (TiN), yttrium oxide ($Y_2O_3$), mixtures thereof, or combinations thereof. In embodiments herein, the substrate support 105 further includes the bias electrode 104 embedded in the dielectric material thereof. In some embodiments, one or more characteristics of the RF power used to maintain the plasma 101 in the processing region over the bias electrode 104 are determined and/or monitored by measuring an RF waveform established at the bias electrode 104.

In one configuration, the bias electrode 104 is a chucking pole used to secure (i.e., chuck) the substrate 103 to the substrate supporting surface 105A of the substrate support 105 and to bias the substrate 103 with respect to the processing plasma 101 using one or more of the pulsed-voltage biasing schemes described herein. Typically, the bias electrode 104 is formed of one or more electrically conductive parts, such as one or more metal meshes, foils, plates, or combinations thereof.

In some embodiments, the bias electrode 104 is electrically coupled to a clamping network 116, which provides a chucking voltage thereto, such as static DC voltage between about −5000 V and about 5000 V, using an electrical conductor, such as the coaxial power delivery line 106 (e.g., a coaxial cable). As will be discussed further below, the clamping network 116 includes bias compensation circuit elements 116A, a DC power supply 155, and a bias compensation module blocking capacitor, which is also referred to herein as the blocking capacitor C5. The blocking capacitor C5 is disposed between the output of a pulsed voltage (PV) waveform generator 150 and the bias electrode 104.

The substrate support assembly 136 may further include the edge control electrode 115 that is positioned below the edge ring 114 and surrounds the bias electrode 104 and/or is disposed a distance from a center of the bias electrode 104. In general, for a processing chamber 100 that is configured to process circular substrates, the edge control electrode 115 is annular in shape, is made from a conductive material, and is configured to surround at least a portion of the bias electrode 104. In some embodiments, such as shown in FIG. 1, the edge control electrode 115 is positioned within a region of the substrate support 105. In some embodiments, as illustrated in FIG. 1, the edge control electrode 115 includes a conductive mesh, foil, and/or plate that is disposed a similar distance (i.e., Z-direction) from the substrate supporting surface 105A of the substrate support 105 as the bias electrode 104. In some other embodiments, the edge control electrode 115 includes a conductive mesh, foil, and/or plate that is positioned on or within a region of a quartz pipe 110, which surrounds at least a portion of the bias electrode 104 and/or the substrate support 105. Alternately, in some other embodiments (not shown), the edge control electrode 115 is positioned within or is coupled to the edge ring 114, which is disposed on and adjacent to the substrate support 105. In this configuration, the edge ring 114 is formed from a semiconductor or dielectric material (e.g., AlN, etc.).

The edge control electrode 115 can be biased by use of a PV waveform generator that is different from the PV waveform generator 150 that is used to bias the bias electrode 104. In some embodiments, the edge control electrode 115 can be biased by use of a PV waveform generator 150 that is also used to bias the bias electrode 104 by splitting part of the power to the edge control electrode 115. In one configuration, a first PV waveform generator 150 of the first PV source assembly 196 is configured to bias the bias electrode 104, and a second PV waveform generator 150 of a second PV source assembly 197 is configured to bias the edge control electrode 115.

A power delivery line 157 electrically connects the output of the PV waveform generator 150 of the first PV source assembly 196 to an optional filter assembly 151 and the bias electrode 104. While the discussion below primarily discusses the power delivery line 157 of the first PV source assembly 196, which is used to couple a PV waveform generator 150 to the bias electrode 104, the power delivery line 158 of the second PV source assembly 197, which couples a PV waveform generator 150 to the edge control electrode 115, will include the same or similar components. The electrical conductor(s) within the various parts of the power delivery line 157 may include: (a) one or a combination of coaxial cables, such as a flexible coaxial cable that is connected in series with a rigid coaxial cable, (b) an insulated high-voltage corona-resistant hookup wire, (c) a bare wire, (d) a metal rod, (e) an electrical connector, or (f) any combination of electrical elements in (a)-(e). The optional filter assembly 151 includes one or more electrical elements that are configured to substantially prevent a current generated by the output of the RF generator 118 from flowing through the power delivery line 157 and damaging the PV waveform generator 150. The optional filter assembly 151 acts as a high impedance (e.g., high Z) to RF signal generated by the RF generator 118, and thus inhibits the flow of current to the PV waveform generator 150.

The second PV source assembly 197 includes a clamping network 116 so that a bias applied to the edge control electrode 115 can be similarly configured to the bias applied to the bias electrode 104 by the clamping network 116 coupled within the first PV source assembly 196. Applying similarly configured PV waveforms and clamping voltages to the bias electrode 104 and edge control electrode 115 can help improve the plasma uniformity across the surface of the substrate during processing and thus improve the plasma processing process results.

In some embodiments, the processing chamber 100 further includes the quartz pipe 110, or collar, that at least partially circumscribes portions of the substrate support assembly 136 to prevent the substrate support 105 and/or the support base 107 from contact with corrosive processing gases or plasma, cleaning gases or plasma, or byproducts thereof. Typically, the quartz pipe 110, the insulator plate 111, and the ground plate 112 are circumscribed by a liner 108. In some embodiments, a plasma screen 109 is positioned between the cathode liner 108 and the sidewalls 122 to prevent plasma from forming in a volume underneath the plasma screen 109 between the liner 108 and the one or more sidewalls 122.

Figure 2A:
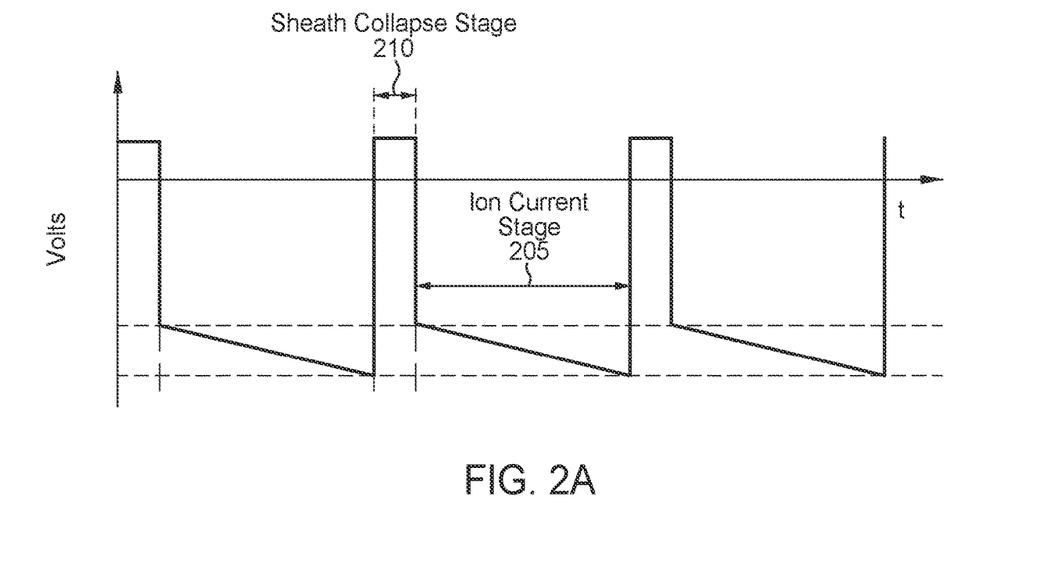
FIG. 2A shows a voltage waveform that may be applied to an electrode of a processing chamber, according to one or more embodiments.
Figure 2B:
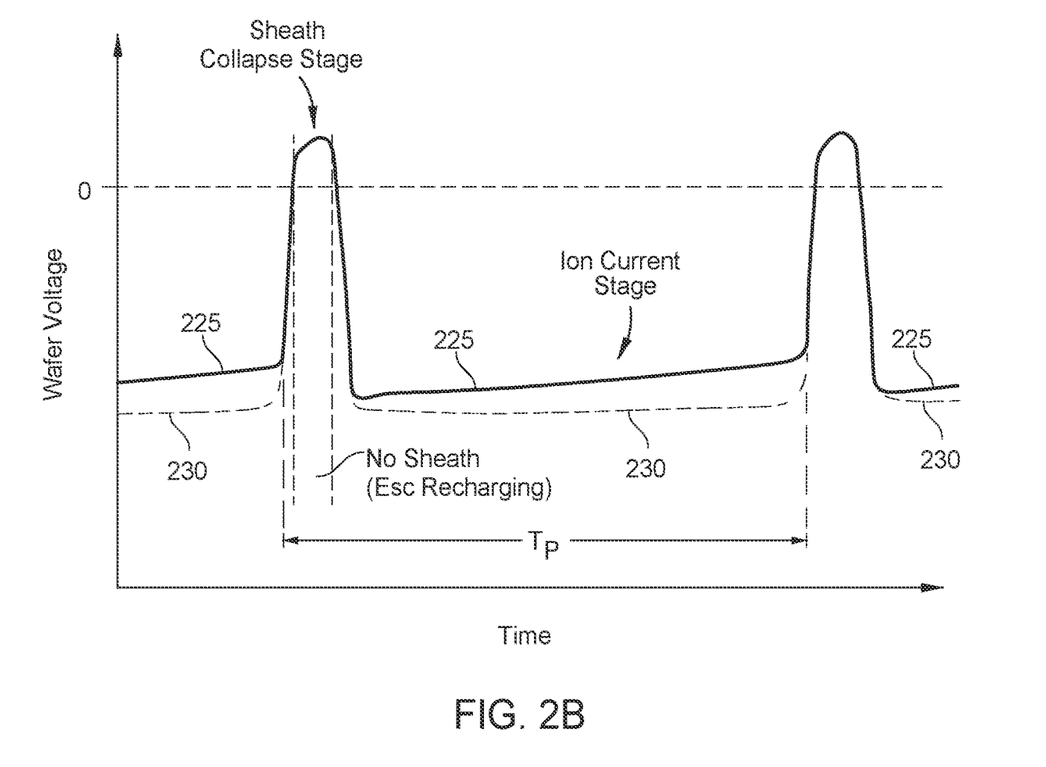
FIG. 2B shows a voltage waveform that is established on a substrate due to a voltage waveform applied to an electrode of a processing chamber.

FIG. 2A illustrates a voltage waveform that may be established at an electrode of a processing chamber. FIG. 2B illustrates an example of different types of voltage waveforms 225 and 230 established at a substrate surface due to different voltage waveforms, similar to the voltage waveform shown in FIG. 2A, that are separately established at an electrode (e.g., bias electrode 104) within the processing chamber. The waveforms include two stages: an ion current stage 205 and a sheath collapse stage 210, as shown. At the beginning of the ion current stage 205, a drop of substrate voltage creates a high voltage sheath above the substrate, accelerating positive ions to the substrate. The positive ions that bombard the surface of the substrate during the ion current stage 205 deposit a positive charge on the substrate surface, which if uncompensated for causes a gradual increase in the substrate voltage positively during the ion current stage 205, as illustrated by voltage waveform 225 in FIG. 2B. However, the uncontrolled accumulation of positive charge on the substrate surface undesirably gradually discharges the sheath and chuck capacitors, slowly decreasing the sheath voltage drop and bringing the substrate potential closer to zero, as illustrated by voltage waveform 225. The accumulation of positive charge results in the voltage drop (e.g., voltage becoming less negative) in the voltage waveform established at the substrate surface (FIG. 2B). However, a voltage waveform that is established at the electrode that has a negative slope during the ion current stage 205, as shown in FIG. 2A, can be generated so as to establish a square shaped region (e.g., near zero slope) for an established substrate voltage waveform, as shown by voltage waveform 230 in FIG. 2B. Implementing the slope in the waveform established at the electrode during the ion current stage 205 may be referred to as current compensation. The voltage difference between the beginning and end of the ion current stage 205 determines an ion energy distribution function (IEDF) width. The greater the voltage difference, the wider the IEDF width. To achieve mono-energetic ions and a narrower IEDF width, operations are performed to flatten the substrate voltage waveform in the ion current stage 205 using current compensation.

Generation Technique for Waveform Generation

Certain embodiments of the present disclosure are generally directed to a technique for generating a pseudo-staircase voltage waveform for controlling ion energy distribution (IED) in a plasma. For example, the technique may involve using a network of external storage capacitors and switches, charged and discharged in a periodic transient mode, to achieve a desired pulse waveform that forms a desired IED at the surface of the substrate.

Figure 3A:
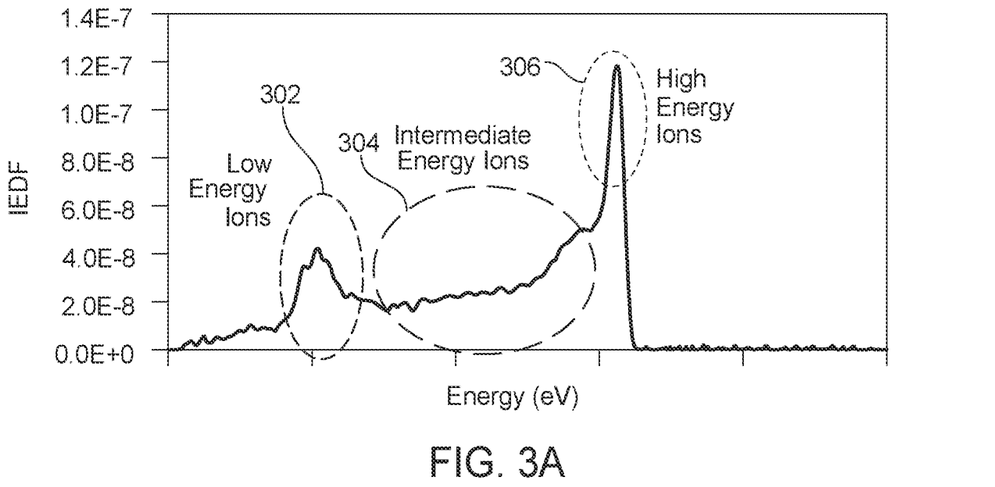
FIG. 3A illustrates a typical ion energy distribution (IED) when using a single frequency excitation waveform.

FIG. 3A illustrates a typical IED when using a single radio frequency (RF) frequency excitation waveform. As shown, the IED has a bimodal shape having a high energy peak 306, a low energy peak 302, and intermediate energy ions (e.g., associated with an intermediate energy region 304). From the aspect of plasma etching processes, only the ions at or near the high-energy peak have the energy and directionality to overcome the ion generated charging effect, created in the material that is being etched, and reach the bottom of a feature and enable etching reactions. Ions with intermediate energies are not beneficial for etch processes as they do not have the directionality and will tend to hit the sidewall of the feature, often resulting in an undesired IED induced feature bow profile. Ions with low energy are important for etch processes as they clean the mask surface and maintain the shape of the mask layer, preventing hole clogging. Some embodiments of the present disclosure provide techniques that allow for manipulating the IED from a broad IED to a narrow IED clustered around any desired value.

Figure 3B:
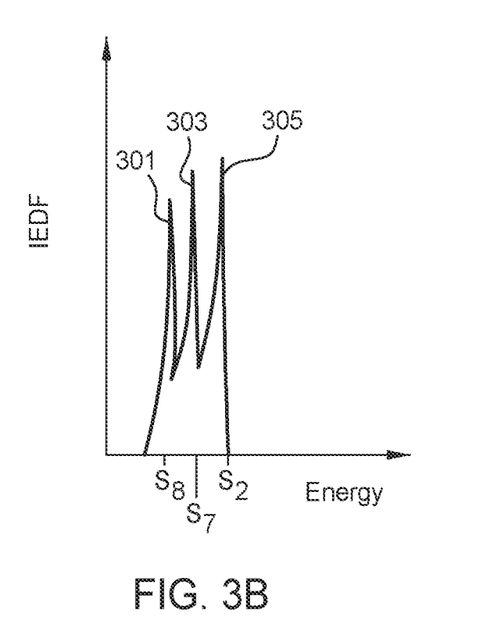
FIG. 3B is a graph illustrating an IED function (IEDF), in accordance with certain aspects of the present disclosure.

FIG. 3B is a graph illustrating an IED function (IEDF), in accordance with certain embodiments of the present disclosure. The IEDF includes multiple high energy peaks such as a first energy peak 301, a second energy peak 303, and a third energy peak 305. As shown, the energy associated with the first energy peak 301 is slightly less than the energy associated with the second energy peak 303, and the energy associated with the second energy peak 303 is slightly less than the energy associated with the third energy peak 305. The narrow energy distribution and multiple IED peaks can be useful in forming features on a surface of a substrate that have a desirable atomic precision. Ions associated with the third energy peak 305 (or high-energy peak) will generally be configured to have the energy and directionality to reach to the bottom of a high-aspect ratio feature that is being etched and enable etching reactions. From the aspect of plasma etching processes, ions at or near the high energy peak are also typically configured to have enough energy and directionality to overcome the ion generated charging effect, created in the material that is being etched. The ions within the first energy peak 301 (low energy peak) and/or second energy peak 303 may be generated such that they do not have enough energy to reach the bottom of the feature during etching. However, the low energy and medium energy ions can still be useful in etch processes, since these ion energies are important for etch processes as they clean the mask surface and maintain the shape of the mask layer, preventing hole clogging.

The IED may be affected based on operation/closure of different switches of a waveform generator (e.g., a second switch (S2) 512, a seventh switch (S7) 524, and/or an eighth switch (S8) 526 of a waveform generator 500 as will be described in more detail with respect to FIG. 5). The techniques described herein allow for the control of each switch and duration of the closure of each switch, affecting the IED. By controlling the switches, the IED shown in FIG. 3B may be implemented using a pseudo-staircase voltage waveform 400, as described in more detail herein.

Figure 4:
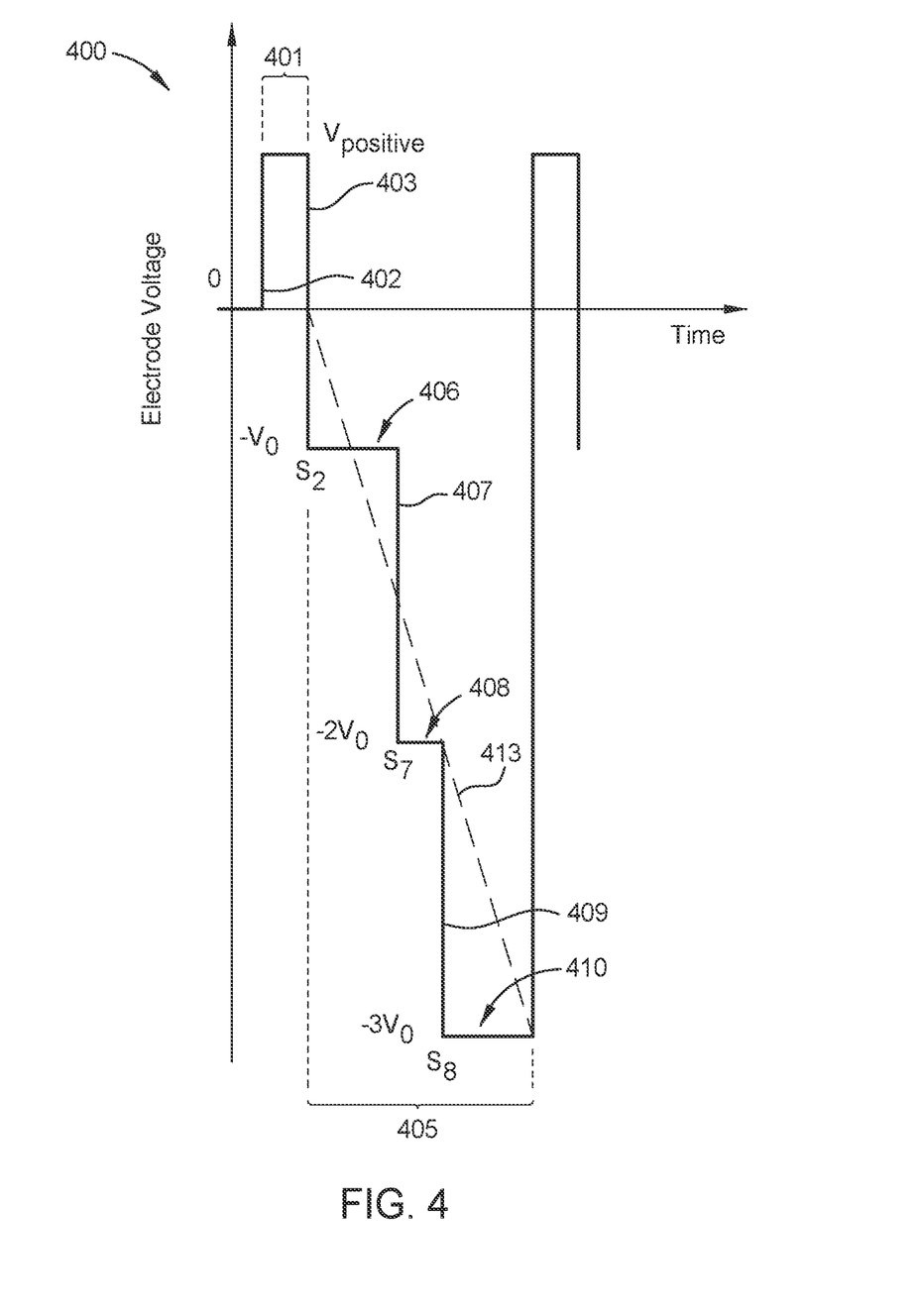
FIG. 4 illustrates a pseudo-staircase voltage waveform generated using a waveform generator, in accordance with certain embodiments of the present disclosure.

FIG. 4 illustrates a pseudo-staircase voltage waveform 400 generated using a waveform generator (e.g., the waveform generator 500 shown in FIG. 5), in accordance with certain embodiments of the present disclosure. In some embodiments, a waveform generator 500 at least forms part of the pulsed waveform generator 150 of the first PV source assembly 196 and/or a waveform generator 500 at least forms part of the pulsed waveform generator 150 of the second PV source assembly 197. The pseudo-staircase voltage waveform 400 is applied to bias a wafer to achieve a specific IED. A pulse repetition frequency of the pseudo-staircase voltage waveform 400 may vary from tens of kHz to hundreds of kHz, such as between 50 kHz and 800 kHz, such as between 100 kHz and 400 kHz. The pseudo-staircase voltage waveform 400 may be divided into multiple steps of various time durations in one pulse waveform cycle.

As shown, the pseudo-staircase voltage waveform 400 includes waveform regions 401 and 405. The waveform region 401 (e.g., corresponding to the sheath collapse stage 210 of FIG. 2) includes a direct current (DC) signal, and the waveform region 405 (e.g., corresponding to the ion current stage 205 of FIG. 2) includes a voltage pseudo-staircase that can be used for ion current compensation.

During a portion of the waveform region 401 within a pulse waveform cycle, plasma bulk electrons are attracted to a surface of a substrate (e.g., the substrate supporting surface 105A of the substrate 103 of FIG. 1) due to a rising edge 402 of the pseudo-staircase voltage waveform 400, and a positive voltage ($V_{positve}$) is established at an electrode. The substrate surface and the electrode (e.g., the bias electrode 104 of FIG. 1) form a capacitive element (e.g., an electrostatic chuck capacitor ($C_{esc}$)), which during this stage will cause an equal amount of a positive charge on the electrode (e.g., as compared to a negative charge on the substrate) to cancel a field generated by an accumulation of electrons provided by a bulk plasma.

At a falling edge 403 of the pseudo-staircase voltage waveform 400, the ions are neutralized by the electrons due to the application of the pseudo-staircase voltage waveform 400 to the electrode. A negative voltage ($-V_0$) is established at the electrode, and a negative DC sheath potential is established on the substrate surface. This is the origin of a higher energy peak (e.g., the third energy peak 305 of the IEDF of FIG. 3B). The DC sheath potential, or the higher ion energy can be approximated using a voltage drop ($\Delta V$) (e.g., $V_{positive}+V_0$) at the falling edge 403 and a ratio between $C_{esc}$ and sheath capacitance ($C_{sheath}$) based on the equation:

$$V_{dc} = -(V_{positive} + V_0)\frac{C_{esc}}{C_{esc} + C_{sheath}}$$

Accordingly, the waveform region 401 serves to sustain the plasma in the chamber and establish a DC sheath potential for the higher energy peak.

As incoming ions neutralize the electrons on the substrate surface and positive charges are accumulated on the substrate surface, the DC sheath potential decreases if there is no means of ion compensation (also referred to as current compensation). Consequently, ions incident onto the substrate surface will not be mono-energetic due to the change in the DC sheath potential. In an effort to compensate for the collection of the positive charge on the substrate during the ion current stage found within the waveform region 405, in some embodiments, a voltage pseudo-staircase is applied to the electrode to compensate for the change in the sheath potential, thereby maintaining a constant sheath potential Vac (mono-energy peak). In some embodiments, the voltage pseudo-staircase, applied to the electrode in the waveform region 405, is divided into multiple sub-steps, each having a time duration $\Delta t$ that can be constant or varied between sub-steps.

In the first sub-step 406, which has a time duration $\Delta t$, a total amount of positive charges $\Delta Q=I_{ion} \times \Delta t$ is accumulated on the substrate surface, where the ion current ($I_{ion}$) can be calculated based on a time derivative of the electrode voltage (V) and the sheath capacitance ($C_{sheath}$) as $$I_{ion} = C_{sheath}\frac{dV}{dt},$$

and thus the DC sheath potential decreases by $\Delta Q/C_{sheath}$. To compensate this change in the DC sheath potential, a voltage drop at a falling edge 407 of the pseudo-staircase voltage waveform 400 is applied (e.g., the electrons are supplied to the electrode from a network of capacitors of a capacitor array based on closure of switches as will be described in more detail with respect to FIG. 5). The amount of the voltage drop applied during one or more of the sub-steps of the voltage pseudo-staircase may be determined from a known or measured ion current $I_{ion}$ created during plasma processing, such that the voltage pseudo-staircase tends to follow a desired ion compensation curve 413.

In the second sub-step 408, a voltage of $-2V_0$ is applied to the electrode. A voltage drop (e.g., associated with falling edge 409) can be implemented by applying a voltage at the end of the second sub-step 408. In one embodiment, the voltage drop applied at the falling edge 409 has a same magnitude as the voltage drop applied at the falling edge 407, as described in more detail herein with respect to FIG. 5. After the falling edge 409, a third sub-step 410 begins during which a voltage of $-3V_0$ is applied to the electrode.

During the falling edge 407 and the falling edge 409, the electrons (from one or more capacitors of the capacitor array) supplied to the electrode cancel the field generated by the accumulation of electrons due to the positive charges of the incoming ions, and thereby the DC sheath potential is maintained, which creates a digital (depending on the switch states) cluster of ion energy around $-(V_{positive}+V_0)$ volts. It should be noted that although the example shown in FIG. 4 includes three sub-steps 406, 408, 410 in the waveform region 405, any number of sub-steps may be implemented in the waveform region 405.

Figure 5:
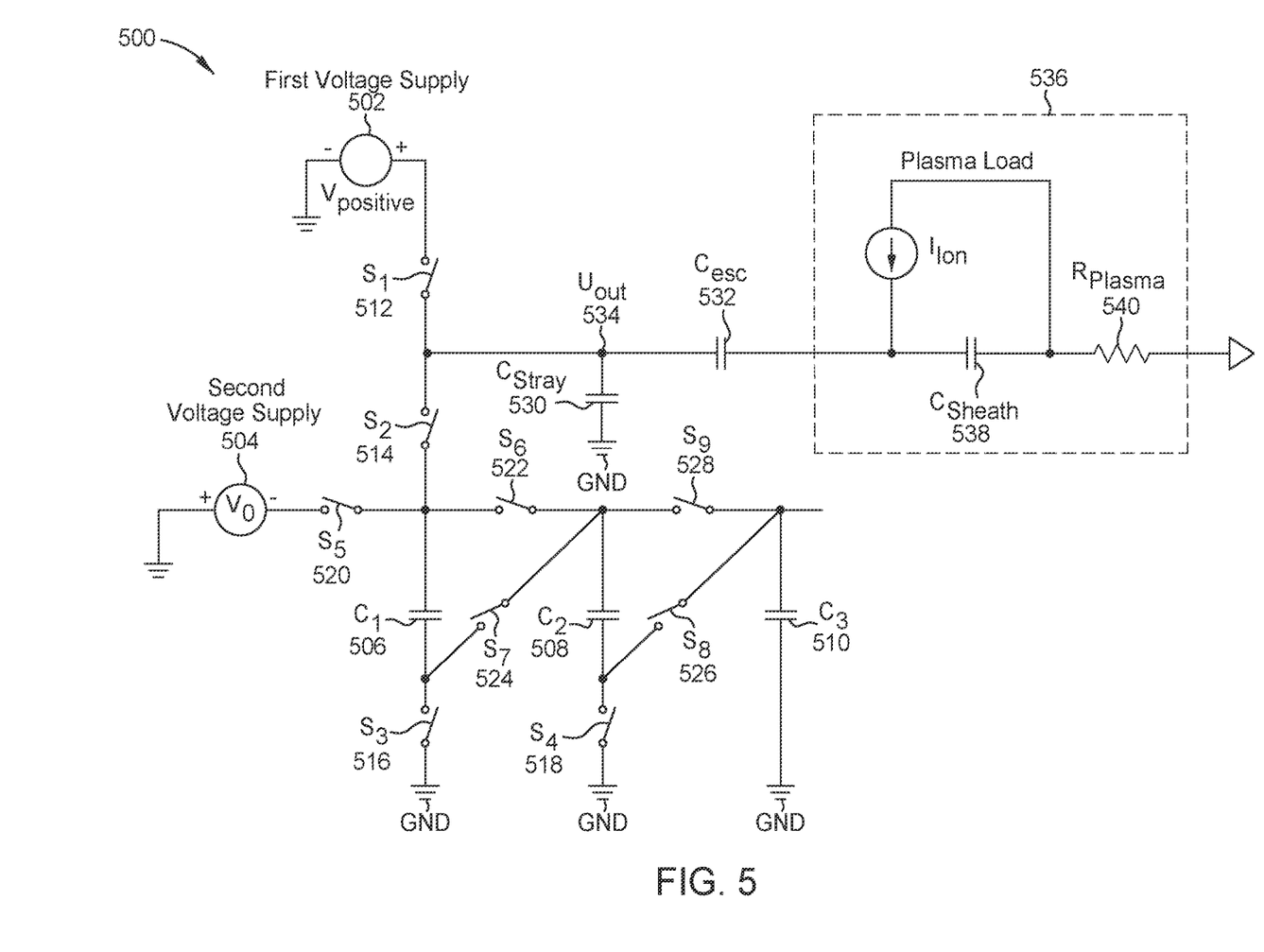
FIG. 5 illustrates an example implementation of a waveform generator for digital control of IED, in accordance with certain aspects of the present disclosure.

FIG. 5 illustrates an example implementation of a waveform generator 500, in accordance with certain embodiments of the present disclosure. In some embodiments, the waveform generator 500 is configured to generate the pseudo-staircase voltage waveform 400 (of FIG. 4), which can be established at an electrode (e.g., the bias electrode 104 of FIG. 1) or a support base (e.g., the support base 107 of FIG. 1). The waveform generator 500 may be used to implement one or more of the waveform generator assemblies 150, described above with respect to FIG. 1.

The waveform generator 500 includes voltage power supplies such as a first voltage supply 502 (e.g., a positive DC voltage source) and a second voltage supply 504 (e.g., a negative DC voltage source).

The waveform generator 500 further includes capacitors (also referred to as pulse capacitive elements) such as a first capacitor (C1) 506, a second capacitor (C2) 508, and a third capacitor (C3) 510. The first capacitor 506, the second capacitor 508, and the third capacitor 510 may serve as voltage storage elements that may be charged using a charging circuit.

The waveform generator 500 further includes switches (e.g., transistors) such as a first switch (S1) 512, a second switch (S2) 514, a third switch (S3) 516, a fourth switch (S4) 518, a fifth switch (S5) 520, a sixth switch (S6) 522, a seventh switch (S7) 524, an eighth switch (S8) 526, and a ninth switch (S9) 528. The switches may be power transistors (e.g., metal-oxide-semiconductor field-effect transistors (MOSFETs)). The switches may be high voltage solid-state relays. The switches may be used to select a current flow path (also referred to as an output current path) for the waveform generator 500.

In certain aspects, the first switch 512, the fifth switch 520, the sixth switch 522, and the ninth switch 528 operate in a same manner. For example, the first switch 512, the fifth switch 520, the sixth switch 522, and the ninth switch 528 are opened or closed at the same time, as described in more detail with respect to FIG. 6.

The first switch 512 is coupled between the first voltage supply 502 and the output node 534. The second switch 514 is coupled between the output node 534 and a capacitor array. The capacitor array includes at least the first capacitor 506 and the second capacitor 508. The first capacitor 506 is coupled to the second switch 514. The second capacitor 508 is selectively coupled to a node 517 between the first capacitor 506 and the third switch 516. The third switch 516 is coupled between the first capacitor 506 and an electrical ground node. The fourth switch 518 is coupled between the second capacitor 508 and the electrical ground node.

The capacitor array is connected to a charging circuit. The charging circuit includes the second voltage supply 504 selectively coupled to each of the first capacitor 506 and the second capacitor 508. The charging circuit further includes the fifth switch 520 coupled between the second voltage supply 504 and the first capacitor 506, and the sixth switch 522 coupled between the fifth switch 520 and the second capacitor 508. The seventh switch 524 is coupled to the node 517 between the first capacitor 506 and the third switch 516 and a node 519 between the second capacitor 508 and the sixth switch 522. The third capacitor 510 is selectively coupled to a node 521 between the second capacitor 508 and the fourth switch 518. The eighth switch 526 is coupled to the node 521 between the second capacitor 508 and the fourth switch 518 and a node 523 between the third capacitor 510 and the ninth switch 528.

The waveform generator 500 is coupled to a plasma processing chamber through the output node 534. The plasma processing chamber includes a stray capacitor ($C_{stray}$) 530 and an electrostatic chuck capacitor ($C_{esc}$) 532. The stray capacitor 530 represents a capacitance between an electrode of the plasma processing chamber and an electrical ground node. As noted above, the electrostatic chuck capacitor 532 represents a capacitance between an electrode (e.g., the bias electrode 104 of FIG. 1) and a substrate surface (e.g., the substrate supporting surface 105A of FIG. 1). The electrostatic chuck capacitor 532 is coupled between an output node ($U_{out}$) 534 and a plasma load 536 (which may be a plasma formed in the plasma processing chamber). The plasma load 536 is represented by a sheath capacitor ($C_{sheath}$) 538 (representing ion compensating current and plasma sheath) and a plasma resistive element ($R_{plasma}$) 540 that is coupled to ground through one or more chamber components, such as the chamber lid.

While FIG. 5 illustrates a configuration that includes two voltage sources, three capacitors, and nine switches that are used to form the voltage pseudo-staircase, this configuration is not intended to be limiting as to the scope of the disclosure provided herein since the waveform generator 500 could include more or less number of voltage sources, capacitors, and switches connected in a similar configuration to form the voltage pseudo-staircase. As will be discussed further below, the timing of the opening and closing of the various switches can be controlled by commands sent from a controller (e.g. the system controller 126 of FIG. 1), which may affect the IED. The operation of the waveform generator 500 for generating the pseudo-staircase voltage waveform 400 shown in FIG. 4 is described in more detail with respect to FIG. 6.

Figure 6:
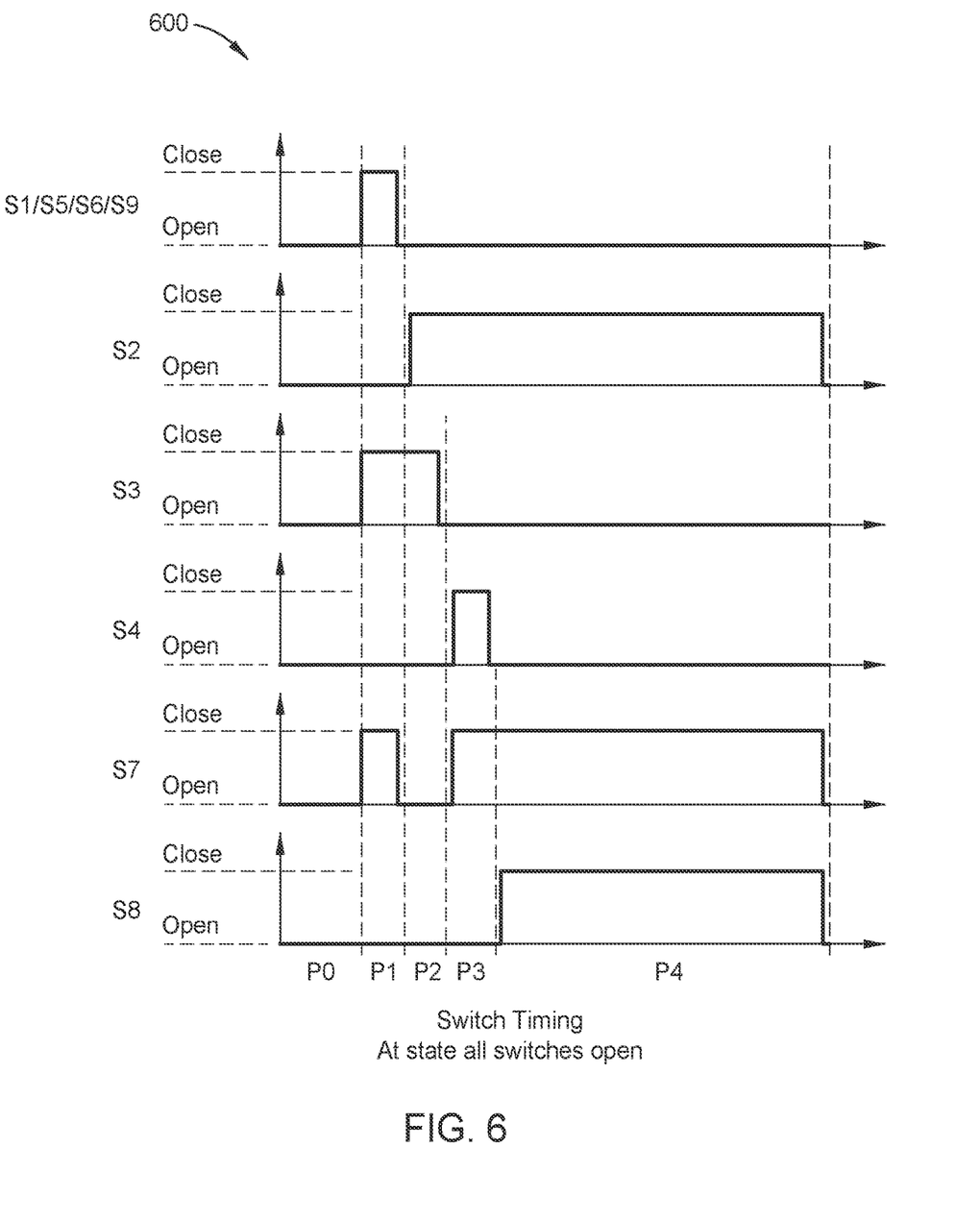
FIG. 6 is a timing diagram illustrating state of switches of the waveform generator of FIGS. 5, in accordance with certain aspects of the present disclosure.

FIG. 6 is a timing diagram 600 illustrating states of switches, in accordance with certain embodiments of the present disclosure. While the discussion below primarily discloses a switch timing process that is performed on a system that includes a waveform generator (e.g., the waveform generator 500 of FIG. 5) to form a pulsed voltage waveform (e.g., the pseudo-staircase voltage waveform 400 of FIG. 4), this configuration is not intended to limiting as to the scope of the disclosure provided herein.

In a first phase (P1) of a waveform cycle (e.g., a cycle of the pseudo-staircase voltage waveform 400), based on a command from a controller, the first switch 512 (S1), the fifth switch 520 (S5), the sixth switch 522 (S6), and the ninth switch 528 (S9) are closed. The second switch 514 (S2) is opened. The third switch 516 (S3) and the fourth switch 518 (S4) are closed.

During the first phase (P1), a positive DC voltage ($V_{positive}$) from the first voltage supply 502 charges the stray capacitor 530 and the electrostatic chuck capacitor 532 (formed by a wafer surface and an electrode). Furthermore, during the first phase (P1), switches 516, 518, 520, 522, and 528 are closed. Therefore, the negative DC voltage ($-V_0$) from the second voltage supply 504 charges the first capacitor 506 (C1), the second capacitor 508 (C2), and the third capacitor 510 (C3) to $-V_0$.

In a second phase (P2) of the waveform cycle, based on the command from the controller, the first switch 512 (S1), the fifth switch 520 (S5), the sixth switch 522 (S6), and the ninth switch 528 (S9) are opened. The second switch 514 (S2) and the third switch 516 (S3) are closed. The seventh switch 524 (S7), the fourth switch 518 (S4), and the eighth switch 526 (S8) are opened. Thus, the first capacitor 506

(C1) (e.g., charged to $V_O$) is coupled to the output node 534, applying the negative voltage $-V_O$ to the output node 534.

During the second phase (P2), at a falling edge of the pulse step (e.g., the falling edge 403 of the pseudo-staircase voltage waveform 400) from Vpositive to $-V_O$, the ions are neutralized by the plasma bulk electrons from the first capacitor 506. The negative voltage $-V_O$ is established at the electrode (e.g., the non-plasma facing side of the electrostatic chuck capacitor 532), and a negative DC sheath potential is established on the wafer surface. As incoming ions neutralize the plasma bulk electrons on the wafer surface, the DC sheath potential decreases if there is no means of current compensation. Accordingly, the energy of the ions incident onto the wafer surface will change over time due to the change in the DC sheath potential (i.e., pulsed waveform droop).

To implement current compensation, the pseudo-staircase voltage waveform 400 is generated by applying different negative voltage magnitudes to the output node 534. For example, in a third phase (P3) of the waveform cycle, based on the command from the controller, the second switch 514 (S2) remains closed. The first switch 512 (S1), the fifth switch 520 (S5), the sixth switch 522 (S6), and the ninth switch 528 (S9) are opened. The third switch 516 (S3) and the eighth switch 526 (S8) are opened. The seventh switch 524 (S7) and the fourth switch 518 (S4) are closed. During the third phase, the negative voltage from the first capacitor 506 (C1) and the second capacitor 508 (C2) is applied on the electrode (e.g., applied to the output node 534). In other words, by closing the seventh switch 524 (S7) and the fourth switch 518 (S4), the first capacitor 506 (C1), and second capacitor 508 (C2) (both charged to $-V_O$) are placed in series. Therefore, the sum of the voltages (e.g., $-2V_O$) of the capacitors 506, 508 is applied to the output node 534.

In a fourth phase (P4) of the waveform cycle, based on the command from the controller, the second switch 514 (S2) remains closed. The first switch 512 (S1), the fifth switch 520 (S5), the sixth switch 522 (S6), and the ninth switch 528 (S9) remain open. The third switch 516 (S3) remains open. The fourth switch 518 (S4) is opened. The seventh switch 524 (S7) and the eighth switch 526 (S8) are closed. During the fourth phase, the negative voltage ($-V_O$) from each of the first capacitor 506 (C1), the second capacitor 508 (C2), and the third capacitor 510 (C3) (e.g., the most negative part of the pseudo-step function ramp and transient voltage) is applied on the output node 534. In other words, during the fourth phase (P4), by closing the seventh switch 524 (S7), and the eighth switch 526 (S8) and opening the fourth switch 518 (S4), the capacitors 506, 508, 510 (each charged to $-V_O$) are placed in series. Therefore, the sum of the voltages (e.g., $-3V_O$) of the capacitors 506, 508, 510 is applied to the output node 534.

After the fourth phase of the waveform cycle, the waveform cycle may be repeated. The application of multiple phases and cycles of the pseudo-staircase voltage waveform 400 may subject the non-plasma facing side of the electrostatic chuck capacitor 532 to an effective ramp and create several instances of DC bias while a plasma facing side of the electrostatic chuck capacitor 532 is receiving the ion discharge current. These instances of the DC bias, which are caused by closures of the switches as described, create different energy peaks (as shown in FIG. 3B) to control the IED in the plasma.

In certain aspects, the first capacitor 506 (C1), the second capacitor 508 (C2), and the third capacitor 510 (C3) may be charged to a specific voltage using the second voltage supply 504, depending on a waveform (e.g., the pseudo-staircase voltage waveform 400) being implemented. In some implementations, the first capacitor 506 (C1), the second capacitor 508 (C2), and the third capacitor 510 (C3) may be charged to greater or lower voltages to implement different voltages levels for the waveform suitable for different implementations.

In certain aspects, the waveform generator 500 maintains a desired negative voltage on a top surface of the electrostatic chuck capacitor 532, as the electrostatic chuck capacitor 532 is constantly being discharged by positive ion current from the plasma load 536, as described herein. For example, the waveform generator 500 uses stored charges in the first capacitor 506 (C1), the second capacitor 508 (C2), and/or the third capacitor 510 (C3) to maintain the negative charge on the electrostatic chuck capacitor 532 by constantly operating in a transient periodic manner.

Although the instantaneous voltage across the electrostatic chuck capacitor 532 may not change under transient conditions, the constant application alone or in combination of the negative voltage from the first capacitor 506 (C1), the second capacitor 508 (C2), and/or the third capacitor 510 (C3) on a non-plasma facing side of the electrostatic chuck capacitor 532 over periods of time will generate the pseudo-staircase voltage waveform 400 that is established at the electrode and substrate. A number (and duration) of steps of the pseudo-staircase voltage waveform 400 may vary, depending on a number of capacitors, timing of switches, and/or a number of voltage supplies used in the waveform generator 500. Based on the constant application of the negative voltage on the non-plasma facing side of the electrostatic chuck capacitor 532, a desired negative voltage on the electrostatic chuck capacitor 532 (i.e., DC bias on a plasma facing side of the electrostatic chuck capacitor 532) is maintained.

Figure 7:
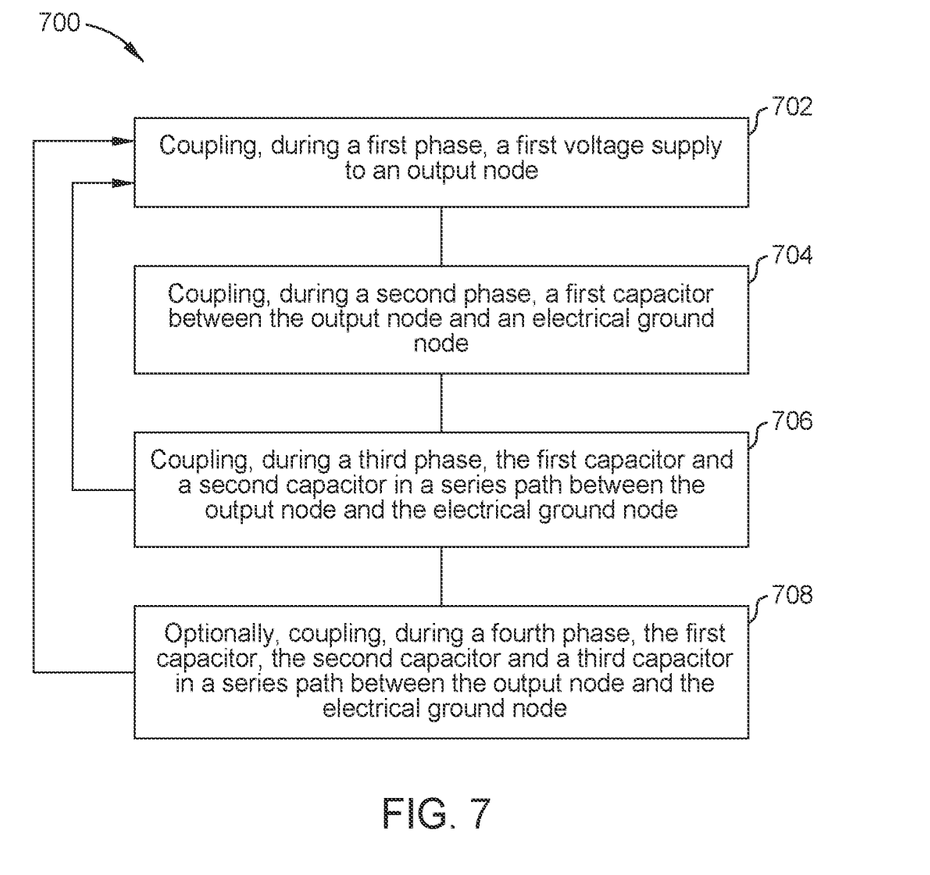
FIG. 7 is a process flow diagram illustrating a method for waveform generation, in accordance with certain aspects of the present disclosure.

FIG. 7 is a process flow diagram illustrating a method 700 for waveform generation. The method 700 may be performed by a waveform generation system including a waveform generator (e.g., the waveform generator 500 of FIG. 5) and/or a system controller (e.g., the system controller 126 of FIG. 1).

At activity 702, the waveform generation system couples, during a first phase of generating a waveform (e.g., the pseudo-staircase voltage waveform 400 of FIG. 4), a first voltage supply (e.g., the first voltage supply 502 of FIG. 5) to an output node (e.g., the output node 534). The output node may be coupled to an electrode disposed within a processing chamber (e.g., the processing chamber 100 of FIG. 1). For example, the output node may be coupled to the bias electrode 104 or the support base 107. The first voltage supply supplies a positive DC voltage (e.g., $V_{positive}$) to the output node.

During the first phase, a first capacitor (e.g., the first capacitor 506 of FIG. 1) and a second capacitor (e.g., the second capacitor 508 of FIG. 1) are charged. For example, the first capacitor and the second capacitor are coupled to a second voltage supply (e.g., the second voltage supply 504 of FIG. 5). The second voltage supply charges the first capacitor and the second capacitor to a desired voltage (e.g., each to a negative voltage $-V_O$).

At activity 704, the waveform generation system couples, during a second phase of generating the waveform, the first capacitor between the output node and an electrical ground node. During the second phase, the output node is provided with the negative voltage (e.g., $-V_O$) from the first capacitor.

At activity 706, the waveform generation system couples, during a third phase of generating the waveform, the first capacitor and the second capacitor in a series path between the output node and the electrical ground node. During the third phase, the output node is provided with the negative voltage (e.g., $-2V_0$) from the first capacitor and the second capacitor. After the third phase of the waveform cycle, the waveform cycle may be repeated.

Optionally, at activity 708, the waveform generation system couples, during a fourth phase of generating the waveform, the first capacitor, the second capacitor and a third capacitor in a series path between the output node and the electrical ground node. During the fourth phase, the output node is provided with the negative voltage (e.g., $-3V_0$) from the first capacitor, the second capacitor and the third capacitor. After the fourth phase of the waveform cycle, the waveform cycle may be repeated.

The term "coupled" is used herein to refer to the direct or indirect coupling between two objects. For example, if object A physically touches object B and object B touches object C, then objects A and C may still be considered coupled to one another—even if objects A and C do not directly physically touch each other. For instance, a first object may be coupled to a second object even though the first object is never directly physically in contact with the second object.

While the foregoing is directed to embodiments of the present disclosure, other and further embodiments of the disclosure may be devised without departing from the basic scope thereof, and the scope thereof is determined by the claims that follow.

What is claimed is:

1. A waveform generator, comprising:
   a first voltage supply;
   a first switch coupled between the first voltage supply and an output node of the waveform generator;
   a second switch; and
   a capacitor array, wherein the second switch is coupled between the output node and the capacitor array, wherein the capacitor array comprises:
      a first capacitor coupled to the second switch;
      a third switch coupled between the first capacitor and an electrical ground node;
      a second capacitor selectively coupled to a node between the first capacitor and the third switch; and
      a fourth switch coupled between the second capacitor and the electrical ground node.

2. The waveform generator of claim 1, further comprising a charging circuit coupled to the capacitor array.

3. The waveform generator of claim 2, wherein the charging circuit comprises a second voltage supply selectively coupled to each of the first capacitor and the second capacitor.

4. The waveform generator of claim 3, wherein the charging circuit further comprises:
   a fifth switch coupled between the second voltage supply and the first capacitor; and
   a sixth switch coupled between the fifth switch and the second capacitor.

5. The waveform generator of claim 4, wherein the charging circuit further comprises a seventh switch coupled to a node between the first capacitor and the third switch and a node between the second capacitor and the sixth switch.

6. The waveform generator of claim 4, wherein the second voltage supply is selectively coupled to a third capacitor.

7. The waveform generator of claim 6, wherein the charging circuit further comprises:
   a ninth switch coupled between the sixth switch and the third capacitor; and
   an eighth switch coupled to a node between the second capacitor and a fourth switch and a node between the third capacitor and the ninth switch.

8. The waveform generator of claim 3, wherein the first voltage supply and the second voltage supply each comprise a direct current (DC) voltage source.

9. The waveform generator of claim 1, wherein the first switch, the second switch, the third switch, and the fourth switch each comprise a transistor.

10. The waveform generator of claim 1, wherein the output node of the waveform generator is coupled to a processing chamber.

11. A method for waveform generator, comprising:
    coupling, during a first phase of generating a waveform, a first voltage supply to an output node;
    coupling, during a second phase of generating the waveform, a first capacitor between the output node and an electrical ground node; and
    coupling, during a third phase of generating the waveform, the first capacitor and a second capacitor in a series path between the output node and the electrical ground node.

12. The method of claim 11, further comprising charging the first capacitor and the second capacitor during the first phase.

13. The method of claim 12, wherein charging the first capacitor and the second capacitor comprises coupling a second voltage supply to the first capacitor and the second capacitor.

14. The method of claim 11, further comprising providing a negative voltage stored on the first capacitor to the output node during the second phase.

15. The method of claim 11, further comprising providing a negative voltage to the output node, the negative voltage being a sum of voltages stored on the first capacitor and the second capacitor.

16. An apparatus for waveform generation, comprising:
    a memory; and
    one or more processors coupled to the memory, the memory and the one or more processors being configured to:
       couple, during a first phase of generating a waveform, a first voltage supply to an output node;
       couple, during a second phase of generating the waveform, a first capacitor between the output node and an electrical ground node; and
       couple during a third phase of generating the waveform, the first capacitor and a second capacitor in a series path between the output node and the electrical ground node.

17. The apparatus of claim 16, wherein the memory and the one or more processors are further configured to charge the first capacitor and the second capacitor during the first phase.

18. The apparatus of claim 17, wherein charging the first capacitor and the second capacitor comprises coupling a second voltage supply to the first capacitor and the second capacitor.

19. The apparatus of claim 16, wherein the memory and the one or more processors are further configured to provide a negative voltage stored on the first capacitor to the output node during the second phase.

20. The apparatus of claim 16, wherein the memory and the one or more processors are further configured to provide a negative voltage to the output node, the negative voltage being a sum of voltages stored on the first capacitor and the second capacitor.

* * * * *